(12) United States Patent
Gurary et al.

(10) Patent No.: US 7,276,124 B2
(45) Date of Patent: Oct. 2, 2007

(54) REACTOR HAVING A MOVABLE SHUTTER

(75) Inventors: Alex Gurary, Bridgewater, NJ (US);
Scott Elman, Monroe Township, NJ (US); Keng Moy, Basking Ridge, NJ (US); Vadim Boguslavskiy, Princeton, NJ (US)

(73) Assignee: Veeco Instruments Inc., Woodbury, NY (US)

( * ) Notice: Subject to any disclaimer, the term of this patent is extended or adjusted under 35 U.S.C. 154(b) by 0 days.

(21) Appl. No.: 11/129,548

(22) Filed: May 13, 2005

(65) Prior Publication Data
US 2005/0217578 A1 Oct. 6, 2005

Related U.S. Application Data

(62) Division of application No. 10/046,426, filed on Jan. 16, 2002, now Pat. No. 6,902,623.

(60) Provisional application No. 60/296,598, filed on Jun. 7, 2001.

(51) Int. Cl.
*C23C 16/00* (2006.01)
*H01L 21/301* (2006.01)
*C23F 1/00* (2006.01)

(52) U.S. Cl. .................. 118/719; 118/724; 156/345.31; 156/345.32; 156/345.37

(58) Field of Classification Search ................ 118/715, 118/719
See application file for complete search history.

(56) References Cited

U.S. PATENT DOCUMENTS 3,656,454 A 4/1972 Schrader

| | | |
|---|---|---|
| 4,309,961 A | 1/1982 | Satoh |
| 4,318,889 A | 3/1982 | Schiller |
| 4,539,933 A | 9/1985 | Campbell et al. |
| 4,565,157 A | 1/1986 | Brors et al. |
| 4,658,513 A | 4/1987 | Strattman |
| 4,690,098 A | 9/1987 | Mertens et al. |
| 4,747,368 A | 5/1988 | Brien et al. |
| 5,046,909 A | 9/1991 | Murdoch |
| 5,346,513 A | 9/1994 | Taniguchi et al. |
| 5,368,648 A | 11/1994 | Sekizuka |
| 5,407,485 A | 4/1995 | Takagi |
| 5,497,727 A | 3/1996 | Mayeda et al. |
| 5,520,742 A | 5/1996 | Ohkase et al. |
| 5,624,499 A | 4/1997 | Mizuno et al. |
| 5,788,799 A | 8/1998 | Steger et al. |

(Continued)

FOREIGN PATENT DOCUMENTS

JP 04157162 5/1992

(Continued)

*Primary Examiner*—Karla Moore
(74) *Attorney, Agent, or Firm*—Lerner, David, Littenberg, Krumholz & Mentlik, LLP

(57) ABSTRACT

A shutter assembly for a reactor includes a cylindrical shutter for selectively closing a passthrough opening of the reactor, the shutter forming a closed loop and including an internal cavity adapted to receive a cooling fluid, tubing connected with the cylindrical shutter for supplying the cooling fluid to the internal cavity, and an actuator connected with the tubing for moving the tubing and the cylindrical shutter. The cylindrical shutter is movable between a first substantially closed position and a second substantially open position.

6 Claims, 4 Drawing Sheets

U.S. PATENT DOCUMENTS

| | | |
|---|---|---|
| 5,854,468 A | 12/1998 | Muka |
| 5,855,677 A | 1/1999 | Carlson et al. |
| 5,942,038 A | 8/1999 | Mayeda et al. |
| 6,001,183 A | 12/1999 | Gurary et al. |
| 6,039,811 A | 3/2000 | Park et al. |
| 6,086,362 A | 7/2000 | White et al. |
| 6,111,225 A | 8/2000 | Ohkase et al. |
| 6,192,827 B1 | 2/2001 | Welch et al. |
| 6,340,501 B1 | 1/2002 | Kamiyama et al. |
| 6,442,950 B1 | 9/2002 | Tung |
| 2002/0069970 A1 | 6/2002 | Noorbakhsh et al. |
| 2002/0076490 A1 | 6/2002 | Chiang et al. |
| 2002/0108571 A1* | 8/2002 | Black et al. ................ 118/715 |

FOREIGN PATENT DOCUMENTS

| | | |
|---|---|---|
| JP | 07070730 A | 3/1995 |
| JP | 09134880 | 5/1997 |

* cited by examiner

REACTOR HAVING A MOVABLE SHUTTER

CROSS-REFERENCE TO RELATED APPLICATIONS

The present application is a divisional of U.S. patent application Ser. No. 10/046,426, filed Jan. 16, 2002, now U.S. Pat. No. 6,902,623, which claims benefit of U.S. Provisional Application Ser. No. 60/296,598, filed Jun. 7, 2001.

BACKGROUND OF THE INVENTION

The present invention relates to reactors for growing epitaxial layers over substrates and more particularly relates to chemical vapor deposition (CVD) reactors designed to minimize thermal and flow field disturbances within the reactor.

Microelectronic elements, such as semiconductor chips, are frequently manufactured by placing semiconductor wafers within a reaction chamber of a chemical vapor deposition (CVD) reactor and growing epitaxial layers on the wafers. The epitaxial layers are typically grown by causing reactant chemicals in gaseous form to flow over the wafers in controlled quantities and at controlled rates. The wafers are then cut into individual semiconductor chips.

The reactant chemicals are generally delivered to the reaction chamber by placing the reactant chemicals in a device known as a bubbler and mixing a carrier gas with the reactant chemicals. The bubbler may include adjustable controls for modifying the concentration of the reactant chemicals in the carrier gas. The carrier gas picks up molecules of the reactant chemicals as the gas passes through the bubbler. The reactant gas is then directed into the CVD reactor via a mass flow controller and flow flange.

There are presently a wide variety of CVD reactors having various designs. These include horizontal reactors wherein a wafer carrier is rotatably mounted inside a reactor and reactant gases are introduced from above the wafer carrier; horizontal reactors with planetary rotation in which the reactant gases pass across a wafer carrier; barrel reactors; and vertical disk reactors in which the reactant gas is injected downwardly onto a substrate surface that is rotating within a reactor. The above described CVD reactors have been successfully used to grow a wide array of epitaxial layers on wafers, including various combinations of semiconductor, thin-film devices and multi-layered structures such as lasers and LED's.

FIG. 1 shows a typical prior art reactor including a wafer 10 mounted on a wafer carrier 12 which, in turn, is mounted on a susceptor 14. The susceptor 14 is mounted on a rotating support spindle 16 for rotating the wafer carrier. The susceptor 14, wafer carrier 12 and wafer 10 are typically located inside reactor 18. A heating assembly 20 is arranged below susceptor 14 for heating the susceptor 14, wafer carrier 12, and wafer 10 mounted thereon. During deposition of epitaxial layers, wafer carrier 12 is rotated so as to enhance the temperature uniformity across the deposition area, as well as the flow uniformity of the reactant gases flowing over the deposition area.

Referring to FIG. 2, wafer carriers 12 typically include a plurality of cylindrical pockets 22 provided on an upper surface thereof for securing the wafers in place as the wafer carrier is rotated. These wafer carriers ordinarily also include an annular flange 24 used for lifting and transporting the wafer carrier into and out of the reaction chamber. During the deposition process, a bottom surface of the wafer carrier may include an annular wall 26 for locating the wafer carrier concentrically on rotatable susceptor 14, and for creating a gap 28 between the upper surface of susceptor 14 and the underside of wafer carrier 12. The presence of gap 28 eliminates localized heating of the wafer carrier that may result from direct contact between wafer carrier 12 and susceptor 14, thereby enhancing the uniform transfer of heat from susceptor 14 to wafer carrier 12.

As suggested above, the conditions or parameters under which the reactant gases are introduced into the reaction chamber have a dramatic effect upon the quality of the epitaxial layers grown on the wafers. These parameters include material viscosity, density, vapor pressure, the flow path of the reactant gases, chemical activity and/or temperature. In order to optimize the quality of the epitaxial layers, the above-identified parameters are frequently modified, and the effects of such modifications studied. One parameter that is frequently altered during research and development efforts is the flow path of the reactant gases. For example, the specific design of flow nozzles, or the distance between the flow nozzle(s) and a wafer carrier is modified.

Reactor designers seek to maintain a uniform temperature and flow fields across the surface of each wafer. The ability to maintain uniform temperatures must be repeatable, precise and independent of process conditions. Deviation from a uniform temperature standard by only a few degrees centigrade may result in severe defects in the quality and nature of devices fabricated from the wafers. Moreover, a disturbance in the uniformity of the flow fields may also result in the growth of defective epitaxial layers. For example, the thickness of one or more epitaxially layers may vary across the face of the wafer.

There have been a number of efforts directed to controlling temperature and flow conditions within a reaction chamber. For example, U.S. Pat. 6,039,811 to Park et al. discloses a reactor for growing epitaxial layers including a gate valve having a cooling jacket attached thereto. The reactor has five cooling jackets: a first cooling jacket on a first sidewall, a second cooling jacket on a second sidewall, a third cooling jacket on an upper wall, a fourth cooling jacket on a lower wall, and a fifth cooling jacket on the gate valve. The reactor includes a wafer transfer chamber having a robot arm for transferring a wafer from a cassette chamber to a reaction chamber. The reactor also includes a wafer cooling chamber for cooling the wafer after the fabricating process is complete. A gate valve, formed on a first sidewall, separates the wafer transfer chamber from the reaction chamber, and a gas injection opening passes through an upper wall of the reactor. A coolant, such as water or a mixture of water and ethylene glycol, is used in the cooling jackets.

U.S. Pat. 6,086,362 to White et al. discloses a chemical deposition chamber having an opening for transferring substrates into and out of the chamber. The chamber includes a chamber body that is heated by resistive elements secured thereto. The chamber also includes a lid secured to the chamber body. An opening in a sidewall of the chamber body provides a passageway for transferring substrates into and out of the chamber. The chamber also has a gas delivery tube for delivering reactanct gases to the interior of the chamber. As the chamber is heated, cooling water tubes in thermal communication with outer walls of the chamber maintain the temperature of the chamber walls within a desired range so as to prevent the chamber walls from becoming too hot, a condition which may adversely affect the uniformity of epitaxial layers grown on wafers.

U.S. Pat. Nos. 5,497,727 and 5,942,038 to Mayeda et al. disclose a cooling element for a deposition chamber having an upper vessel and a lower vessel with opposing sealing flanges that extend around the circumference thereof. A cooling assembly is mounted on the sealing flange, and a cooling medium, such as water, is passed through the cooling assembly to reduce the operating temperature of a portion of a resilient sealing member in contact with the sealing flange, thereby extending the useful life of the resilient sealing member.

U.S. Pat. 4,747,368 to Brien et al. discloses a chemical vapor deposition chamber having a manifold surrounded by cooling tubes. The deposition chamber is adapted to receive wafer substrates that are supported within the chamber and heated to a predetermined reaction temperature. A manifold, disposed within the chamber, has a plurality of openings therein for evenly distributing reactant gases over the wafer substrates for optimizing the growth of epitaxial layers on the substrates. The chamber includes a door for inserting and removing substrates from the reactor, and a sealing ring that enables the formation of an air-tight seal between the door and the chamber. The cooling tubes surround the manifold for maintaining the manifold at an optimal temperature for growing epitaxial layers. The cooling tubes also prevent the reactant gases from reacting prematurely within the manifold.

In spite of the above improvements, there remains a need for a CVD reactor that minimizes disturbances in the uniformity of thermal and flow fields inside the reactor, thereby resulting in the formation of precise, repeatable and uniform epitaxial layers on wafers.

SUMMARY OF THE INVENTION

In accordance with certain preferred embodiments of the present invention, a reactor for growing epitaxial layers for semiconductor wafers includes a reaction chamber, such as an airtight reaction chamber made of stainless steel. The reactor preferably includes a passthrough opening for inserting and removing wafers and/or wafer carriers from the reaction chamber. The reactor also desirably includes a cylindrical shutter located inside the reaction chamber for selectively closing the passthrough opening. The cylindrical shutter is desirably movable between a first position for closing the passthrough opening and a second position for opening the passthrough opening. The cylindrical shutter desirably includes an internal cavity that is adapted to receive a cooling fluid, such as water. Although the present invention is not limited by any particular theory of operation, it is believed that utilizing a cylindrical shutter that substantially surrounds the wafer carrier will minimize flow field disturbances, thereby resulting in uniform epitaxial layers. Moreover, providing a cooling fluid to the internal cavity of a shutter will minimize thermal discontinuities across the wafer carrier. In certain preferred embodiments, the cooling fluid is a fluid selected from the group consisting of water, oil and any other liquid with a boiling temperature of about 100 degrees Celsius or greater The reactor may include tubing in fluid communication with the internal cavity of the shutter for supplying the cooling fluid to the internal cavity. The tubing may include at least one inlet tube for introducing the cooling fluid into the shutter and at least one outlet tube for removing the cooling fluid from the shutter. The inlet and outlet tubes desirably circulate the cooling fluid through the shutter during operation of the reactor. In certain preferred embodiments, the tubing includes two or more inlet tubes for introducing the cooling fluid into the internal cavity of the shutter and two or more outlet tubes for removing the cooling fluid from the internal cavity of the shutter. The tubing is desirably connected to the shutter and moves simultaneously with the shutter as the shutter travels between its first and second positions.

The reactor also desirably includes an injection flange secured to the reaction chamber for introducing reactant gases inside the reaction chamber. As used herein, the term reactant gases means any gases and vapors existing at conditions prevailing within the reaction chamber, and may include gases introduced into the reaction chamber at elevated temperatures and reduced pressures. The reactant gases may be diluted by mixing another gas therewith, such as an inert gas. The CVD reactor may also include one or more reactant gas injectors for introducing the reactant gas into the interior region of the chamber, such as those disclosed in commonly assigned U.S. patent application Ser. No. 09/146,224, filed Sep. 2, 1998, the disclosure of which is hereby incorporated by reference herein. Each gas injector preferably includes one or more passageways for passing the reactant gas from the exterior region of the chamber, through the apertures in the walls of the chamber, and into the interior region thereof.

The CVD reactor may include a wafer carrier that is mounted within the interior region of the reaction chamber. The wafer carrier desirably includes a first surface having a growth area for receiving one or more wafers. The first surface of the wafer carrier may have depressions or pockets for receiving the individual wafers. The substrate carrier is preferably mounted for rotation within the interior region of the chamber so that the one or more wafers may be rotated while the reactant gases are introduced into the interior region of the chamber and atop the wafers. In certain embodiments, the substrate carrier is mounted for rotating in a substantially horizontal plane. In other embodiments, the substrate carrier rotates within a substantially vertical plane. In yet further embodiments, the substrate carrier may rotate within any plane lying between horizontal and vertical planes.

The reactor may also include one or more heating elements in communication with the reaction chamber for heating the wafers and/or wafer carriers secured therein. The heating elements desirably provide a uniform temperature across the top surfaces of the wafers. In certain preferred embodiments, the heating element(s) are provided inside the reaction chamber. The reaction chamber may also have one or more heat shields provided therein, adjacent the one or more heating elements, for directing heat from the heating elements toward the wafers and/or wafer carriers.

In other preferred embodiments of the present invention, a reactor for growing epitaxial layers on wafers and/or wafer carriers includes a reaction chamber having a passthrough opening for inserting and removing wafer carriers from the reaction chamber, and a cylindrical shutter located inside the reaction chamber for selectively closing the passthrough opening. The cylindrical shutter is desirably movable between a first position for closing the passthrough opening and a second position for opening the passthrough opening. The cylindrical shutter is desirably substantially hollow and includes an internal cavity adapted to receive a cooling fluid. The reactor also desirably includes tubing in fluid communication with the internal cavity of the cylindrical shutter for supplying the cooling fluid to the internal cavity, and a rotatable spindle having an upper end located inside the reaction chamber, with at least one wafer carrier securable to the upper end of the spindle. When the wafer carrier has been secured atop the spindle, the cylindrical shutter preferably surrounds the outer perimeter of the wafer carrier. By completely surrounding the wafer carrier, as opposed to surrounding only a portion of the wafer carrier, flow field and temperature discontinuities are avoided.

In certain preferred embodiments, the tubing for the cooling fluid has an upper end connected to the shutter and a lower end located outside the reaction chamber and in communication with a reservoir of the cooling fluid. The reactor includes a movable plate having the tubing connected thereto so that the movable plate and tubing move simultaneously together when the shutter is moving between the opened and closed positions. An actuating element is connected to the movable plate for moving the movable plate, the tubing and the shutter between the first position for opening the passthrough opening and the second position for closing the passthrough opening. The tubing desirably slides through openings in the base plate of the reactor. The reactor may also include a guide element in contact with the movable plate for guiding movement of the movable plate along an axial direction substantially parallel to a longitudinal axis of the tubing.

These and other preferred embodiments will be provided in more detail below.

DETAILED DESCRIPTION

Figure 1:
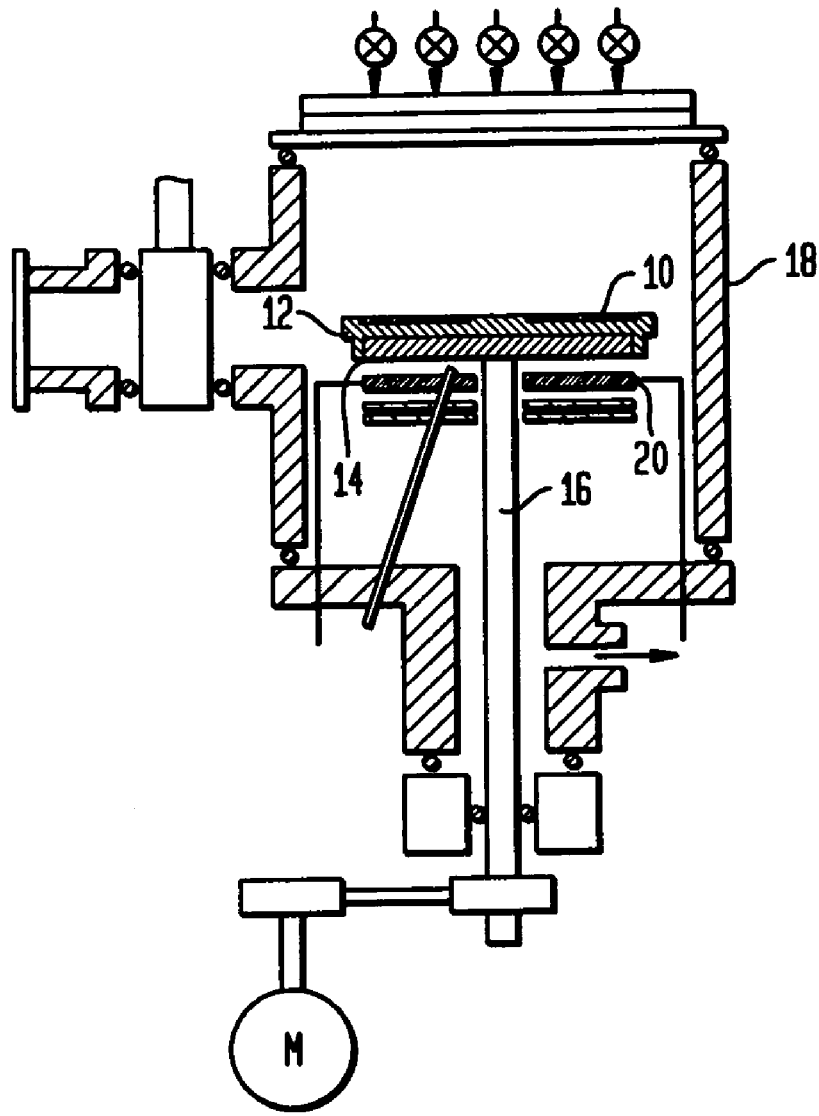
FIG. 1 shows a cross-sectional view of a prior art reactor including a wafer carrier, susceptor and rotatable spindle.
Figure 2:
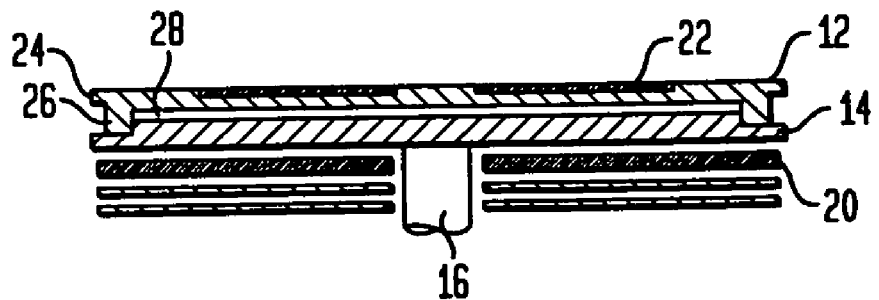
FIG. 2 shows an enlarged view of the wafer carrier, susceptor and rotatable spindle of FIG. 1.
Figure 3A:
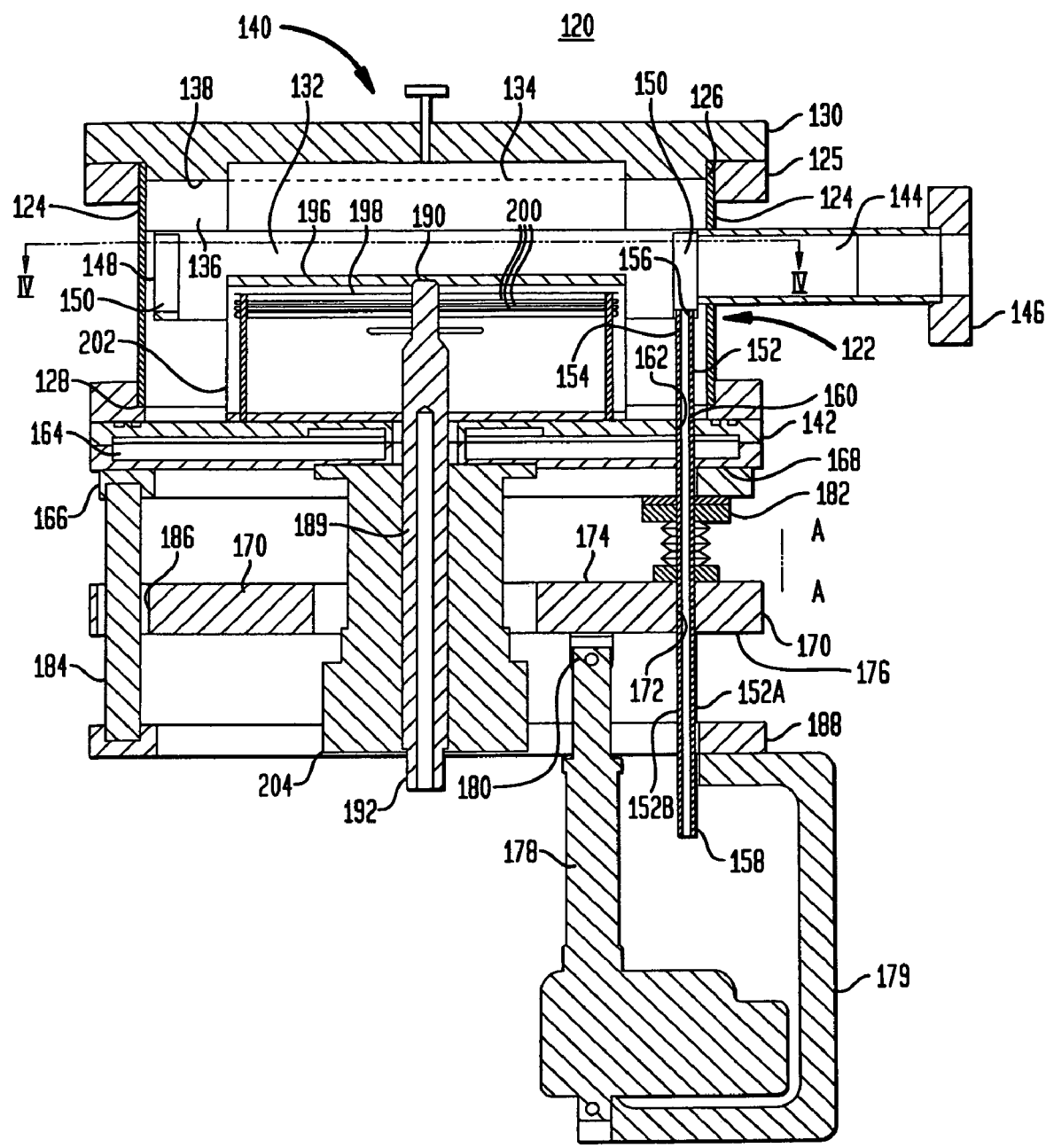
FIG. 3A shows a cross-sectional view of a reactor with a shutter in a closed position, in accordance with certain preferred embodiments of the present invention.

Referring to FIG. 3A, in accordance with one preferred embodiment of the present invention, a reactor 120, such as a chemical vapor deposition (CVD) reactor is preferably made of vacuum-grade stainless steel. The reactor desirably includes a reaction chamber 122 having a cylindrical wall 124 with an upper end 126 and a lower end 128 remote therefrom. Reactor 120 desirably includes an injector flange 130 secured over the upper end 126 of cylindrical wall 124. Injector flange 130 preferably introduces reactants, such as reactant gases for growing epitaxial layers, into an interior region 132 of the reaction chamber. In particular preferred embodiments, injector flange 130 includes a showerhead type water-cooled injector for introducing the reactants inside the reaction chamber 122. A water-cooled element 136 may be positioned between an underside 138 of injector flange 130 and cylindrical wall 124 for maintaining the injector flange within a preferred temperature range.

The injector flange 130 is preferably disk shaped and has an outer periphery which substantially conforms to the shape of a circular opening at the top of the cylindrical wall 124 so that when the injector flange 130 is secured to the reaction chamber 122, the injector flange 130 and reaction chamber form an air-tight seal. The CVD reactor preferably includes a sealing element 125 for forming the air-tight seal between the cylindrical wall 124 and the injector flange 130. The injector flange may also include a plurality of bores (not shown) adjacent the outer periphery thereof so that fasteners, such as bolts or screws, may be placed through the bores for securing the injector flange to the chamber. Once the injector flange has been secured atop the cylindrical wall and an air-tight seal has been formed therebetween, the injector flange may remain permanently secured to the chamber. In other preferred embodiments, the injector flange may be removable for gaining access to the inside of the reactor.

Reactor 120 may also include an exhaust conduit (not shown) for removing exhaust gases from the inside or interior region 132 of reaction chamber 122. In certain preferred embodiments, the exhaust conduit may extend from a bottom portion of the reaction chamber 122. Reactor 120 also preferably includes a base plate 142 secured over the lower edge 128 of cylindrical wall 124. Base plate 142 is preferably affixed to a lower end of cylindrical wall 124. As such, base plate 142 is stationary. The stationary base plate 142 may have a cavity for receiving a cooling fluid for maintaining the base plate at an optimal temperature for growing uniform epitaxial layers.

Figure 4:
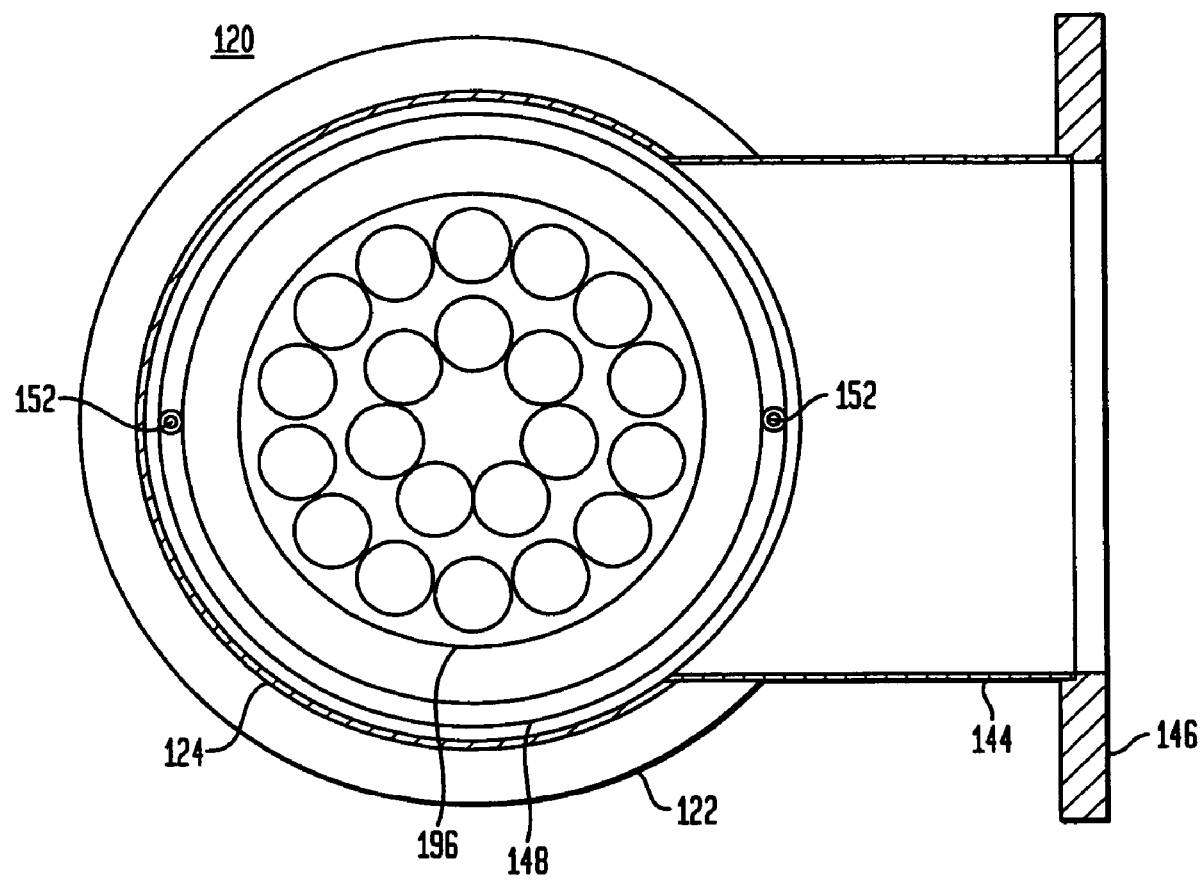
FIG. 4 shows a top view of the reactor of FIG. 3A taken along cross-sectional line IV-IV.

Reaction chamber 122 preferably includes a passthrough opening 144 extending through cylindrical wall 124 for inserting a wafer carrier into, and removing the wafer carrier from, the interior region 132 of reaction chamber 122. Referring to FIGS. 3A and 4, passthrough opening 144 preferably includes a flange 146 connectable through a gate valve (not shown) with a loading apparatus for inserting and removing the wafer carriers from the reaction chamber 122. The cylindrical wall 124 may include a cooling jacket (not shown) in thermal communication therewith. The cooling jacket preferably receives a coolant therein that serves to maintain the temperature of cylindrical wall 124 within preferred ranges for optimizing formation of uniform epitaxial layers.

The preferred embodiments of the CVD reactor disclosed herein may be used to grow a broad range of epitaxial layers over wafers. These include such Group III-V compound semiconductors as GaAs, GaP, $GaAs_{1-x}P_x$, $Ga_{1-y}Al_yAs$, $Ga_{1-y}In_yAs$, AlAs, InAs, InP, InGaP, InSb, GaN, InGaN, and the like. However, the CVD reactors disclosed herein may also be utilized to produce other compounds. These include Group II-VI compounds, such as ZnSe, CdTe, HgCdTe, CdZnTe, CdSeTe, and the like; Group IV-IV compounds, such as SiC, diamond, and SiGe; as well as oxides, such as YBCO, BaTiO, $MgO_2$, ZrO, $SiO_2$, ZnO and ZnSiO; and metals, such as Al, Cu and W. Furthermore, the resultant materials will have a wide range of electronic and optoelectronic applications, including high brightness light emitting diodes (LED's), lasers, solar cells, photocathodes, HEMT's and MESFET's.

Figure 3B:
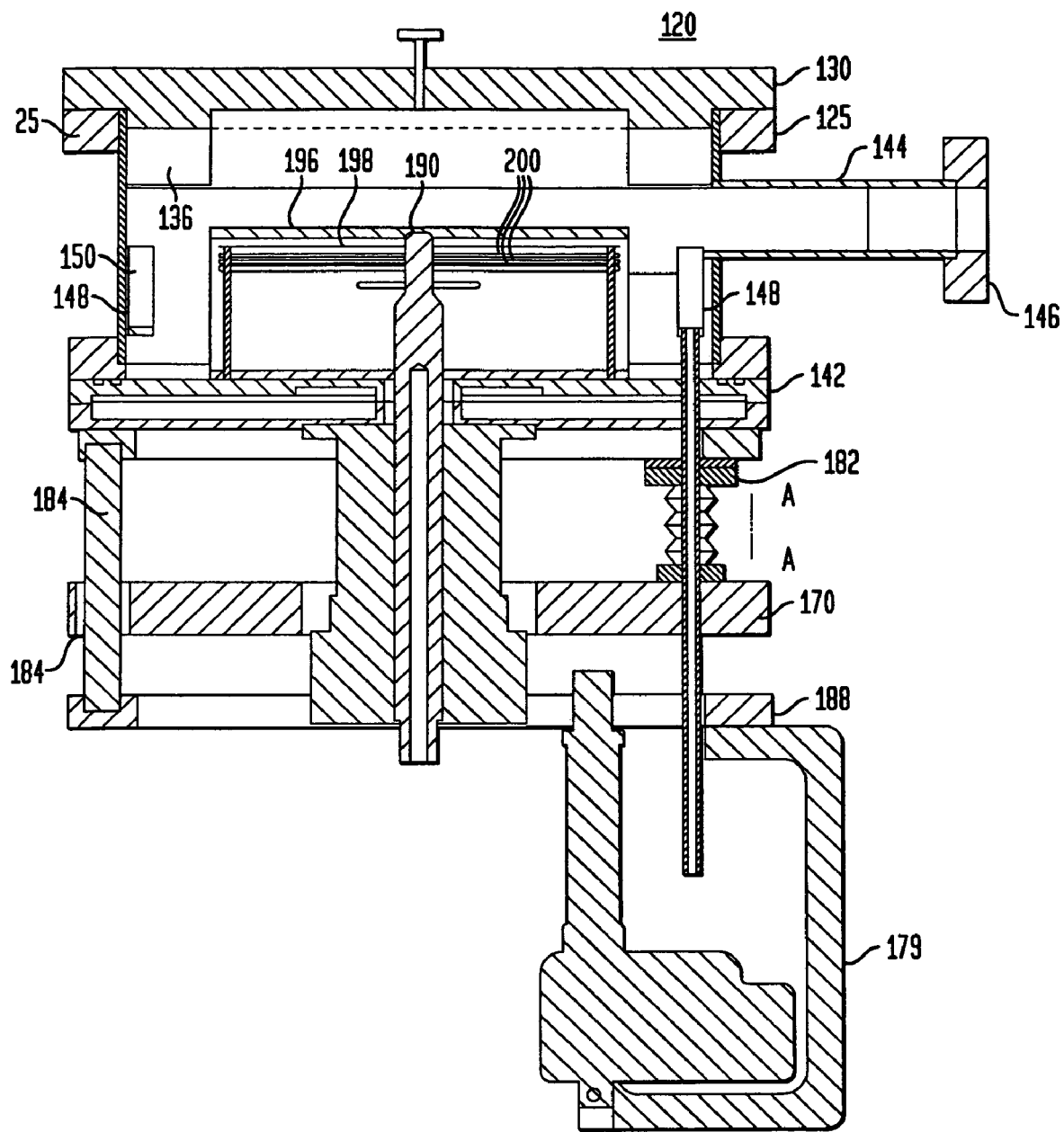
FIG. 3B shows a cross-sectional view of the reactor of FIG. 3A with the shutter in the open position.

Referring to FIGS. 3A and 3B, the reactor includes a movable, cylindrical shutter 148. Cylindrical shutter 148 is preferably movable between open and closed positions for selectively closing passthrough opening 144. As shown in FIG. 3A, passthrough opening 144 is substantially closed by substantially cylindrical shutter 148 during an epitaxial layer deposition process. Cylindrical shutter 148 desirably has an internal cavity 150. and reactor 120 includes tubing 152 in fluid communication with the internal cavity 150. A cooling fluid passes through the tubing and into the internal cavity 150 for maintaining the temperature of shutter 148 within desired ranges. As a result, the cooling fluid may be continuously recirculated within the internal cavity 150 so as to maintain a desired cooling temperature for shutter 148. Each tube 152 desirably includes an upper end 154 secured to a bottom wall 156 of shutter 148. In specific preferred embodiments, bottom wall 156 of shutter 148 includes openings (not shown) for receiving the upper ends 154 of tubing 152. The upper ends 154 of tubing 152 are preferably permanently secured in the openings (not shown) of bottom wall 156. Tubing 152 also includes a lower end 158 preferably in fluid communication with a source of cooling fluid, such as a reservoir of water (not shown). An intermediate portion 160 of tubing 152 between upper and lower ends 154, 158 extends through an opening 162 of stationary base plate 142. Base plate 142 may include a base plate cavity 164 for receiving a cooling fluid. An intermediate portion 160 of tubing 152 preferably slides freely through the opening 162 of stationary base plate 142. As will be described in more detail below, it is particularly preferred that tubing slide freely relative to base plate 142 for moving shutter 148 in an axial direction designated A-A, the axial direction A-A being substantially parallel to the longitudinal axis of tubing 152. Reactor 120 also desirably includes a spacer plate 166 attached to an underside 168 of base plate 142.

Reactor 120 may also include a movable plate 170 under base plate 142. Movable plate 142 is movable toward and away from injection flange 130 along axis A-A. Movable plate 170 desirably has an upper surface 174, a lower surface 176, and an opening extending therebetween. Tubing 152 for supplying the cooling fluid preferably extends through the opening 172 of movable plate, however, tubing 152 is secured to movable plate 170. As a result, tubing 152 and movable plate 170 move simultaneously with one another. Reactor 120 also has an actuating element 178 having an arm 180 connected to the underside 176 of movable plate 170. Actuating element 178 may be actuated for moving the movable plate toward and away from base plate 142 in a direction substantially parallel to the axis designated A-A. A flexible bellows structure 182 desirably maintains an airtight seal with an underside 168 of base plate 142. Bellows 182 also allows movable plate 170 and tubing 152 to move relative to base plate 142.

Reactor 120 includes a linear motion guide 184 extending through a guide opening 186 of movable plate 170. The linear motion guide 184 guides movement of movable plate 170 toward and away from base plate 142 in a direction substantially parallel to the axis A-A. Reactor 120 also includes a base plate 188 mounted atop base member 179 of actuating element 178.

Reactor 120 also includes a spindle 189 having an upper end 190 located within the interior region 132 of reaction chamber 122 and a lower end 192 located outside reaction chamber 122. In certain preferred embodiments, spindle 189 has an internal cavity adapted to receive a cooling fluid. Upper end 190 of spindle 189 is sized and shaped to secure wafer carriers 196 thereon. The wafer carrier 196 may be adapted to hold one or more semiconductor wafers used for growing epitaxial layers thereon. Reactor 120 also includes radiant heating elements 198 for ensuring uniform temperatures across the top surface of wafer carrier and/or the semiconductor wafers secured thereon. Reactor 120 may also include heat shields 200 that direct heat from the radiant heating elements toward wafer carrier and wafers stored thereon. In the particular embodiment shown in FIG. 3A, radiant heating elements 198 and heat shields 200 extend in directions substantially parallel to one another. Reaction chamber 122 may also include a second heat shield 202 extending in a direction transverse to first heat shields 200. Second heat shield 202 may be cylindrical in shape and may surround the outer perimeter of wafer carrier 196. Reactor 120 includes a rotary feedthrough 204 secured to base plate 142. Rotary feedthrough 204 may be a ferrofluidic type feedthrough that is operated using an electrical motor (not shown). The rotary feedthrough preferably forms an airtight seal at the interface between rotary feedthrough 204 and base plate 142 so as to maintain a vacuum within the interior region 132 of reaction chamber 122.

Shutter 148 is movable between a first position (FIG. 3A) for closing passthrough opening 144 and a second position (FIG. 3B) for opening passthrough opening 144 so as to allow one or more wafer carriers 196 to be inserted into and/or removed from the interior region 132 of reaction chamber 122. After a wafer carrier has been placed atop spindle 189, shutter 148 may be moved from the second open position to the first closed position until an upper end of shutter abuts against an underside of water-cooled element 136, thereby closing passthrough opening 144. Once shutter 148 has been closed, reactants (not shown) are introduced through baffle plate 134 of injector flange 130.

Although the present invention is not limited by any particular theory of operation, it is believed that introducing cooling fluid into the internal cavity 150 of shutter 148 provides more responsive control of the temperature of shutter 148 at a desired temperature level so as to minimize thermal discontinuities across the wafer surfaces upon which epitaxial layers are grown. As is known to those skilled in the art, temperature discontinuities across the face of a wafer may result in the formation of defective epitaxial layers. For example, temperature discontinuities may cause the reactant gases to react prematurely, too late, or at different rates which may change the character of the epitaxial layer or a specific region of the epitaxial layer. The cooled shutter 148 also preferably provides for uniform flow fields across the top surface of wafer carrier 196.

The use of a cylindrical shutter in certain preferred embodiments also minimizes thermal and flow field discontinuities because, inter alia, the shutter completely surrounds the outer perimeter of the wafer carrier which is preferable to a shutter that borders only a portion of the peripheral edge of the wafer carrier.

The provision of uniform temperature and flow fields results in the formation of uniform epitaxial layers on wafers. When a deposition run is finished, shutter 148 is moved downward by force transferred from actuating element 178 through movable tubing 152, and then to shutter 148. Once shutter 148 has been moved to the second open position shown in FIG. 3B, wafer carrier 196 may be removed from reactor 120 through passthrough opening 144, and another wafer carrier secured atop spindle 189.

As will be appreciated, numerous variations and combinations of the features discussed above may be utilized without departing from the present invention as further defined by the claims. Accordingly, the foregoing description of the preferred embodiments merely illustrates certain aspects of the present invention and in no way limits the scope of the invention

What is claimed is:

1. A shutter assembly for a reactor comprising:
a cylindrical shutter for selectively closing a passthrough opening of said reactor, said shutter forming a closed loop and including an internal cavity adapted to receive a cooling fluid; tubing connected with said cylindrical shutter for supplying said cooling fluid to said internal cavity;
an actuator connected with said tubing for moving said tubing and said cylindrical shutter, wherein said cylindrical shutter is movable between a first substantially closed position and a second substantially open position; and
a movable plate between said cylindrical shutter and said actuator, wherein said tubing is permanently secured to said movable plate.

2. The shutter assembly as claimed in claim 1, wherein said tubing has an upper end secured to said cylindrical shutter and a lower end in fluid communication with a source of the cooling fluid.

3. The shutter assembly as claimed in claim 1, wherein said tubing extends through an opening in said movable plate.

4. The shutter assembly as claimed in claim 3, further comprising a flexible bellows surrounding a portion of said tubing.

5. The shutter as claimed in claim 1, wherein said cylindrical shutter is adapted for substantially surrounding an outer perimeter of a wafer carrier.

6. The shutter assembly as claimed in claim 1, wherein said cooling fluid is selected from the group consisting of gas, water, oil and liquids having a boiling temperature of 100 degrees Celsius or greater.

* * * * *

UNITED STATES PATENT AND TRADEMARK OFFICE
CERTIFICATE OF CORRECTION

| | | |
|---|---|---|
| PATENT NO. | : 7,276,124 B2 | Page 1 of 1 |
| APPLICATION NO. | : 11/129548 | |
| DATED | : October 2, 2007 | |
| INVENTOR(S) | : Alex Gurary et al. | |

It is certified that error appears in the above-identified patent and that said Letters Patent is hereby corrected as shown below:

Title Page;
On the face of the patent:
    (75) Inventors, line 1, "Alex Gurary" should read -- Alexander Gurary --.

Column 1, line 48, "LED's" should read -- LEDs --.
Column 6, line 45, "HEMT's and MESFET's" should read -- HEMTs and MESFETs --.
Column 8, line 43, "the invention" should read -- the invention. --.

Signed and Sealed this

Nineteenth Day of August, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,276,124 B2 | Page 1 of 1 |
| APPLICATION NO. | : 11/129548 | |
| DATED | : October 2, 2007 | |
| INVENTOR(S) | : Alex Gurary et al. | |

It is certified that error appears in the above-identified patent and that said Letters Patent is hereby corrected as shown below:

Title Page;
On the face of the patent:
    (75) Inventors, line 1, "Alex Gurary" should read -- Alexander Gurary --.

Column 1, line 48, "LED's" should read -- LEDs --.
Column 6, line 45, "HEMT's and MESFET's" should read -- HEMTs and MESFETs --.
Column 8, line 43, "the invention" should read -- the invention. --.
Column 9, line 4, "shutter as" should read -- shutter assembly as --.

This certificate supersedes the Certificate of Correction issued August 19, 2008.

Signed and Sealed this

Sixteenth Day of September, 2008

JON W. DUDAS
*Director of the United States Patent and Trademark Office*